March 24, 1959 S. P. WOLSKY 2,879,457
OHMIC SEMICONDUCTOR CONTACT
Filed Oct. 28, 1954
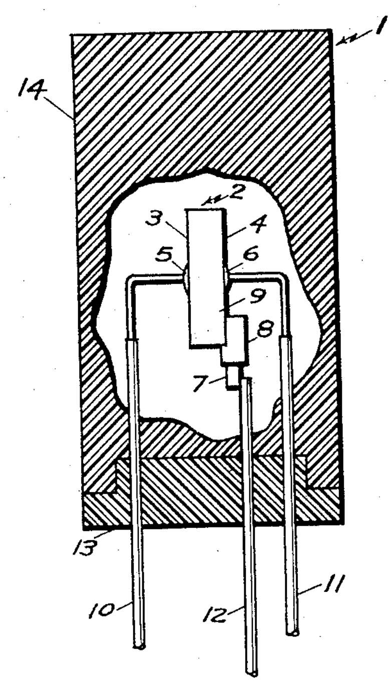
INVENTOR
SUMNER P. WOLSKY
BY Elmer J. Gorn
ATTORNEY United States Patent Office 2,879,457
Patented Mar. 24, 1959

2,879,457

OHMIC SEMICONDUCTOR CONTACT

Sumner P. Wolsky, Waltham, Mass., assignor to Raytheon Manufacturing Company, Waltham, Mass., a corporation of Delaware Application October 28, 1954, Serial No. 465,203

2 Claims. (Cl. 317—235)

This invention relates generally to the fabrication of electrical translation devices which include a semiconductive material such as silicon, and more particularly to an improved method and means for attaining a suitable ohmic contact to the silicon body.

In the preparation of rectifiers, transistors, phototransistors, and the like, which utilize a body of silicon having areas of different conductivity type designated as N-type and P-type, it is necessary in certain instances to make an ohmic contact to a P-type base layer of the silicon body. In the past, considerable difficulty has been encountered in providing such a contact, which displayed both mechanical strength and desirable electrical properties. In techniques heretofore employed, it has been common to first plate the surface of the silicon with a suitable metal, for example, rhodium, and then solder the electrode to the plated surface. Although the plated layer provided good electrical properties, this method proved unsatisfactory since, when attempts were made to solder the electrode to the plated layer, a poor mechanical bond resulted between the silicon and the plate. Another difficulty with the use of an intermediate metal layer resides in the fact that the layer has a tendency to peel from the surface of the silicon thereby preventing a good electrode attachment. Attempts also have been made to solder the electrode directly to the silicon surface; but these met with little success, it being found that the use of an intermediate deposited metal layer was virtually indispensable to the attainment of an ohmic contact having even inferior qualities.

In accordance with the present invention, improved means for making an ohmic contact to the base layer of a chip of silicon having areas of different conductivity types are provided, which allow a strong, permanent connection to be made directly to the chip through the medium of a lead-indium alloying material, thereby eliminating the difficulties encountered in prior techniques. The invention will be better understood as the following description proceeds taken in conjunction with the accompanying drawing wherein the single figure is a sectional view, partly diagrammatic, of a transistor constructed in accordance with the present invention.

Referring now to the figure, there is shown generally at 1 a transistor package assembly including a chip or wafer of silicon 2. Wafer 2 may be cut from a crystal of P-type material, and after lapping and etching treatment the surfaces 3 and 4 of wafer 2 may be doped with a suitable N-type impurity to form P–N junctions in the immediate vicinity of emitter connection 5 and collector connection 6.

In order to form an ohmic contact with the P-type base layer 9 of wafer 2, a metallic tab 7, which may be nickel, for example, is coated with a lead-indium alloy 8 and then fused to wafer 2. A suitable alloy for use in accordance with the invention may comprise a mixture of ninety percent lead and ten percent indium. Prior to attachment to wafer 2, tab 7 may be coated with alloy layer 8 by the simple process of dipping the tab into a molten mixture of the alloy. After the tab 7 has been coated with alloy 8, it may be placed on the silicon wafer 2, and heated to a temperature of 825° C. for approximately ten minutes. It should be understood that neither the temperature nor time of heating is critical, it being only necessary to apply sufficient heat to cause layer 8 to fuse to wafer 2. Contact to the emitter 5, collector 6, and base 9 is made by attaching lead wires 10, 11, and 12, which are insulated from each other, and may be embedded in base mount 13 in order to hold the wafer 2 and its associated connections stationary and relatively free from any stress which may be applied to the lower ends of the lead wires. The fabrication of the unit is completed by providing a protective plastic housing 14, which functions to protect the surface of wafer 2 from contaminating influences, such as dirt and moisture, as well as to provide a medium for absorbing mechanical shocks to which the assembly may be subjected.

By utilizing the lead-indium alloy of the present invention, it has been possible to make excellent ohmic contacts to P-type silicon and silicon alloys. The resistance of ohmic contacts on P-type silicon was of the order of thirty-five ohms when the alloy was employed with a nickel tab. The ohmic resistance R of the base connection was found to vary with the resistivity $\rho$ of the silicon roughly in accordance with the empirical equation $R=\rho+7.5$ over the range $1<\rho<20$ ohm-cm. In addition to the favorable electrical characteristics, the mechanical bond formed between the alloy and the silicon was capable of withstanding more severe strains than contacts heretofore made.

Although there has been described what is considered to be a preferred embodiment of the present invention, various adaptations and modifications thereof may be made without departing from the spirit and scope of the invention. For example, the ratio of the lead-indium mixture may be varied, suitable results being obtained when the proportion of lead ranged from fifty percent to ninety-nine percent. It is, therefore, desired that the appended claims be given a broad interpretation commensurate with the scope of the invention in the art.

What is claimed is:

1. An electrical translation device comprising a chip of silicon having an N-type emitter and collector layer and a P-type base layer, a metallic tab connected to said base by a fused alloy material consisting of lead and indium whereby an ohmic contact to said base layer is formed, conducting leads connected to said emitter and collector junctions and to said metallic tab, a base mount for holding said chip and associated leads, and a protective housing covering said chip and associated leads.

2. An electrical translation device comprising a chip of silicon having an N-type emitter and collector layer and a P-type base layer, a metallic tab connected to said base layer by a fused lead-indium alloy material, said material consisting of at least fifty percent lead whereby an ohmic contact is made to said base layer, conducting leads connected to said emitter and collector junctions and to said metallic tab, a base mount for holding said chip and associated leads, and a protective housing covering said chip and associated leads.

References Cited in the file of this patent

UNITED STATES PATENTS

| | | |
|---|---|---|
| 2,603,693 | Kircher | July 15, 1952 |
| 2,623,105 | Shockley et al. | Dec. 23, 1952 |
| 2,623,273 | Murray et al. | Dec. 30, 1952 |
| 2,644,852 | Dunlap | July 7, 1953 |
| 2,705,767 | Hall | Apr. 5, 1955 |
| 2,711,511 | Pietenpol | June 21, 1955 |
| 2,721,965 | Hall | Oct. 25, 1955 |
| 2,744,218 | Burton et al. | May 1, 1956 |

OTHER REFERENCES

"Scientific American," April 1944, page 155.